(12) United States Patent
Chen et al.

(10) Patent No.: US 10,292,279 B2
(45) Date of Patent: May 14, 2019

(54) DISCONNECT CAVITY BY PLATING RESIST PROCESS AND STRUCTURE

(71) Applicant: Multek Technologies Limited, San Jose, CA (US)

(72) Inventors: Jiawen Chen, Guandong (CN); Pui Yin Yu, Tsuen Wan (HK)

(73) Assignee: Multek Technologies Limited, San Jose, CA (US)

( * ) Notice: Subject to any disclaimer, the term of this patent is extended or adjusted under 35 U.S.C. 154(b) by 137 days.

(21) Appl. No.: 15/159,665

(22) Filed: May 19, 2016

(65) Prior Publication Data

US 2017/0318685 A1    Nov. 2, 2017

(30) Foreign Application Priority Data

Apr. 27, 2016  (CN) .......................... 2016 1 0268670

(51) Int. Cl.
| | |
|---|---|
| *H05K 3/42* | (2006.01) |
| *H05K 3/10* | (2006.01) |
| *H05K 1/11* | (2006.01) |
| *H05K 3/46* | (2006.01) |
| *H05K 1/02* | (2006.01) |

(52) U.S. Cl.
CPC ............ *H05K 3/429* (2013.01); *H05K 1/115* (2013.01); *H05K 2203/0207* (2013.01); *H05K 2203/308* (2013.01)

(58) Field of Classification Search
CPC ......... H05K 1/115; H05K 1/116; H05K 3/429
See application file for complete search history.

(56) References Cited

U.S. PATENT DOCUMENTS 6,459,493 B1    10/2002  Sugiura
6,541,712 B1 *   4/2003  Gately ................... H05K 1/115
                                                      174/258

(Continued)

OTHER PUBLICATIONS

Non-Final Office Action, dated May 14, 2018, U.S. Appl. No. 14/469,150, filed Aug. 26, 2014, Applicant: Weifeng Liu, 14 pages.

(Continued)

*Primary Examiner* — Timothy J Thompson
*Assistant Examiner* — Amol H Patel
(74) *Attorney, Agent, or Firm* — Haverstock & Owens LLP

(57) ABSTRACT

A disconnect cavity is formed within a PCB, where the disconnect cavity is electrically disconnected from a PCB landing layer. The disconnect cavity is formed using a plating resist process which does not require low flow prepreg nor selective copper etching. Plating resist is printed on a core structure selectively positioned within a PCB stack-up. The volume occupied by the plating resist forms a subsequently formed disconnect cavity. After lamination of the PCB stack-up, depth control milling, drilling and electroless copper plating are performed, followed by a plating resist stripping process to substantially remove the plating resist and all electroless copper plated to the plating resist, thereby forming the disconnect cavity. In a subsequent copper plating process, without electric connectivity copper cannot be plated to the side walls and bottom surface of the disconnect cavity, resulting in the disconnect cavity wall being electrically disconnected from the PCB landing layer.

11 Claims, 10 Drawing Sheets

(56) References Cited

U.S. PATENT DOCUMENTS

| | | | |
|---|---|---|---|
| 6,891,272 B1 | 5/2005 | Fjelstad | |
| 7,281,328 B2 | 10/2007 | Lee | |
| 8,222,537 B2* | 7/2012 | Dudnikov, Jr. | H05K 1/0257 174/256 |
| 8,302,301 B2* | 11/2012 | Lau | H05K 1/0251 174/262 |
| 8,918,991 B2 | 12/2014 | Ao | |
| 9,035,197 B2 | 5/2015 | Ao | |
| 9,480,141 B1 | 10/2016 | Harnadeh | |
| 9,554,465 B1 | 1/2017 | Liu | |
| 2003/0007161 A1 | 1/2003 | Bowles | |
| 2003/0170553 A1 | 9/2003 | Eberlein | |
| 2006/0132427 A1 | 6/2006 | Weisberg | |
| 2006/0181715 A1 | 8/2006 | Bristow | |
| 2006/0254811 A1 | 11/2006 | Kirstein | |
| 2007/0137991 A1 | 6/2007 | Fan | |
| 2008/0217708 A1 | 9/2008 | Reisner | |
| 2011/0135248 A1 | 6/2011 | Langer | |
| 2012/0234587 A1* | 9/2012 | Nakamura | H05K 1/115 174/260 |
| 2012/0305775 A1 | 12/2012 | Krolak | |
| 2014/0092379 A1 | 4/2014 | Niiranen | |
| 2014/0185060 A1 | 7/2014 | Doerband | |
| 2014/0192346 A1 | 7/2014 | Vandervalk | |
| 2014/0355006 A1 | 12/2014 | Hotta | |
| 2014/0355009 A1 | 12/2014 | Lin | |
| 2016/0021762 A1* | 1/2016 | Kallman | H05K 3/429 174/266 |
| 2016/0093540 A1 | 3/2016 | Liu | |
| 2017/0131701 A1 | 5/2017 | Nelson | |

OTHER PUBLICATIONS

Non-Final Office Action, dated May 25, 2018, U.S. Appl. No. 15/816,971, filed Nov. 17, 2017, Applicant: Michael James Glickman, 15 pages.

Notice of Allowance dated Jun. 13, 2018, U.S. Appl. No. 15/094,372, filed Apr. 8, 2016, Applicant: Kwan Pen, 14 pages.

* cited by examiner

DISCONNECT CAVITY BY PLATING RESIST PROCESS AND STRUCTURE

CROSS-REFERENCE TO RELATED APPLICATION(S)

This application claims priority under 35 U.S.C. § 119 (a)-(d) of the Chinese Patent Application No: 201610268670.0, filed Apr. 27, 2016 and titled, "DISCONNECT CAVITY BY PLATING RESIST PROCESS AND STRUCTURE," which is hereby incorporated by reference in its entirety for all purposes.

FIELD OF THE INVENTION

The present invention is generally directed to printed circuit boards. More specifically, the present invention is directed to printed circuit boards having a recessed cavity formed by plating resist.

BACKGROUND OF THE INVENTION

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheet/non-conductive substrate. Conductors on different layers are interconnected with plated-through holes called through-hole vias.

A printed circuit board includes a plurality of stacked layers, the layers made of alternating non-conductive layers and conductive layers. The non-conductive layers can be made of prepreg or base material that is part of a core structure, or simply core. Prepreg is a fibrous reinforcement material impregnated or coated with a resin binder, and consolidated and cured to an intermediate stage semi-solid product. Prepreg is used as an adhesive layer to bond discrete layers of multilayer PCB construction, where a multilayer PCB consists of alternative layers of conductors and base materials bonded together, including at least one internal conductive layer. A base material is an organic or inorganic material used to support a pattern of conductor material. A core is a metal clad base material where the base material has integral metal conductor material on one or both sides. A laminated stack is formed by stacking multiple core structures with intervening prepreg and then laminating the stack. A through-hole via is then formed by drilling a hole through the laminated stack and plating the wall of the hole with electrically conductive material, such as copper. The resulting plating interconnects the conductive layers in the laminated stack.

In order to lower overall board thickness after assembly, inclusion of a recessed cavity in the PCB is getting more attention in consumer electronic and telecommunication products. Common fabrication process is to pre-cut low flow prepreg at a cavity area and then control resin squeeze out during the lamination process. This process has disadvantages such as high cost of low flow prepreg, limited supply of low flow prepreg and difficulty in controlling resin squeeze out into the cavity. Additionally, lamination accessories such as release film and conformal film are needed which also add cost. Release film provides a separation between a surface copper layer (conducting layer) in the lamination stack and the conformal film. Conformal film is a thermoplastic layer which softens under lamination temperature and conforms to the area with prepreg pre-cut. Use of low flow prepreg requires higher lamination pressure. Lamination under high pressure and the impact of conformal film can result in increased panel distortion and it is difficult to achieve flat surface for fine line etching or even dielectric thickness across the panel to control impedance. A panel here refers to the finished product of the stack of laminate and prepreg after lamination. In order to solve these issues, a new manufacturing process for forming a cavity within a PCB is needed.

A recessed cavity can be a single layer, few layers or many layers deep into the laminated stack-up of the PCB. One or more of the conductive layers through which the recessed cavity is formed may be interconnected by plating the side walls and bottom surface of the recessed cavity. In some applications, it is desired that the recessed cavity bottom surface, and possibly one or more conductive layers closest to the recessed cavity bottom surface, are not plated and therefore not electrically connected to other conductive layers using the recessed cavity side wall plating. In this case the recessed cavity is a disconnect cavity. One such application is directed to a radio frequency PCB board, where it is common to have a recessed cavity deep within the laminated stack-up of the PCB, with the deepest portion of the recessed cavity forming a transmission cavity. For proper transmission wave propagation through the transmission cavity, the transmission cavity must be clean with nothing that may interfere or distort a transmission wave. In some designs, the transmission cavity wall has to be disconnected from the PCB landing layer, or outer surface to which components are mounted. A possible method for forming such a disconnect cavity is to use pre-cut low flow prepreg at a disconnect cavity area and selective copper etching to disconnect transmission cavity wall from the landing layer. However, it is difficult to control low flow prepreg resin flow into the disconnect cavity. Additionally, selective copper etching to disconnect transmission cavity wall from the landing layer is not effective.

SUMMARY OF THE INVENTION

Embodiments are directed to a disconnect cavity formed within a PCB, where the disconnect cavity is electrically disconnected from a PCB landing layer. A disconnect cavity is formed using a plating resist process which does not require low flow prepreg nor selective copper etching. In this process, plating resist is printed on a core structure selectively positioned within a PCB stack-up. The volume occupied by the plating resist forms a volume of a subsequently formed disconnect cavity. After lamination of the PCB stack-up, the process steps of depth control milling, drilling and electroless copper plating are performed, followed by a plating resist stripping process to substantially remove the plating resist and all electroless copper plating to the plating resist, thereby forming the disconnect cavity. In some embodiments, a residual amount of plating resist remains. In a subsequent copper plating process, without electric connectivity copper cannot be plated to the side walls and bottom surface of the disconnect cavity, resulting in the disconnect cavity wall being electrically disconnected from the PCB landing layer. Presence of the plating resist during the lamination step prevents resin flow into the area that is to form the disconnect cavity, thereby enabling the use of regular flow prepreg in the PCB stack-up.

In an aspect, a printed circuit board is disclosed. The printed circuit board includes a laminated stack comprising a plurality of non-conducting layers and a plurality of conductive layers; a via formed from an outer surface of the laminated stack and terminating within the laminated stack at a terminating end having a terminating surface; and a disconnect cavity at the terminating end of the via, wherein the disconnect cavity comprises the terminating surface and disconnect cavity side walls, further wherein the terminating surface and the disconnect cavity side walls are free of conductive plating. In some embodiments, the via comprises via side walls extending from the outer surface to the disconnect cavity, wherein the via side walls are plated with conductive material. In some embodiments, the disconnect cavity further comprises an opposing surface opposite the terminating surface, wherein the opposing surface has an opening coincident with the via. In some embodiments, the opposing surface is a surface of one of the conductive layers. In some embodiments, the via comprises via side walls extending from the outer surface to the disconnect cavity, wherein the via side walls are plated with conductive material and the plated via side walls are coupled to the opposing surface of the disconnect cavity. In some embodiments, the opposing surface is a surface of one of the non-conductive layers. In some embodiments, the via comprises via side walls extending from the outer surface to the disconnect cavity, wherein the via side walls are plated with conductive material and the plated via side walls are coupled to the opposing surface of the disconnect cavity. In some embodiments, the printed circuit board further comprises residual plating resist on at least portions of the terminating surface, the disconnect cavity side walls or both the terminating surface and the disconnect cavity side walls. In some embodiments, the residual plating resist is a remnant of a plating resist layer that formed a volume of the disconnect cavity. In some embodiments, the plating resist layer prevented plating of the terminating surface and the disconnect cavity side walls. In some embodiments, each of the conductive layers is pattern etched.

In another aspect, a method of manufacturing a circuit board is disclosed. The method includes forming a laminated stack, wherein the laminated stack comprises a plurality of non-conductive layers, a plurality of conductive layers and plating resist layer, wherein the plating resist layer is positioned in an interior of the laminated stack a volume of the plating resist layer forms a subsequent disconnect cavity, forming a via into the laminated stack, wherein the via extends from an outer surface of the laminated stack to the plating resist layer; performing an electroless plating process to plate via side walls and exposed surfaces of the plating resist layer; stripping the plating formed on the exposed surfaces of the plating resist layer and stripping the plating resist layer to form the disconnect cavity at a terminating end of the via, the terminating end defined by a terminating surface, wherein the disconnect cavity comprises the terminating surface and disconnect cavity side walls; and performing an electroplating process to further plate remaining portions of the plating on the via side walls, wherein the terminating surface and the disconnect cavity side walls are free of conductive plating. In some embodiments, forming the laminated stack comprises applying the plating resist layer to a surface of one of the non-conductive layers. In some embodiments, forming the laminated stack further comprises positioning one of the conductive layers on an opposing side of the plating resist layer as the one non-conductive layer. In some embodiments, forming the laminated stack further comprises positioning another one of the non-conductive layers on an opposing side of the plating resist layer as the one non-conductive layer. In some embodiments, stripping the plating resist layer substantially removes all of the plating resist layer from the terminating surface and the disconnect cavity side walls. In some embodiments, stripping the plating resist layer removes all but a residual plating resist on at least portions of the terminating surface, the disconnect cavity side walls or both the terminating surface and the disconnect cavity side walls. In some embodiments, the method further comprises pattern etching the conductive layers in the laminated stack. In some embodiments, the via side wall plating forms electrical interconnections with conductive layers intersecting the via. In some embodiments, performing the electroplating process comprises applying electricity to the plating on the via side walls. In some embodiments, forming the via comprises performing a depth controlled routing process.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a printed circuit board having a disconnect cavity. Those of ordinary skill in the art will realize that the following detailed description of the printed circuit board is illustrative only and is not intended to be in any way limiting. Other embodiments of the printed circuit board will readily suggest themselves to such skilled persons having the benefit of this disclosure.

Reference will now be made in detail to implementations of the printed circuit board as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and timeconsuming, but would nevertheless be a routine undertaking of engineering for those of ordinary skill in the art having the benefit of this disclosure.

Figure 1:
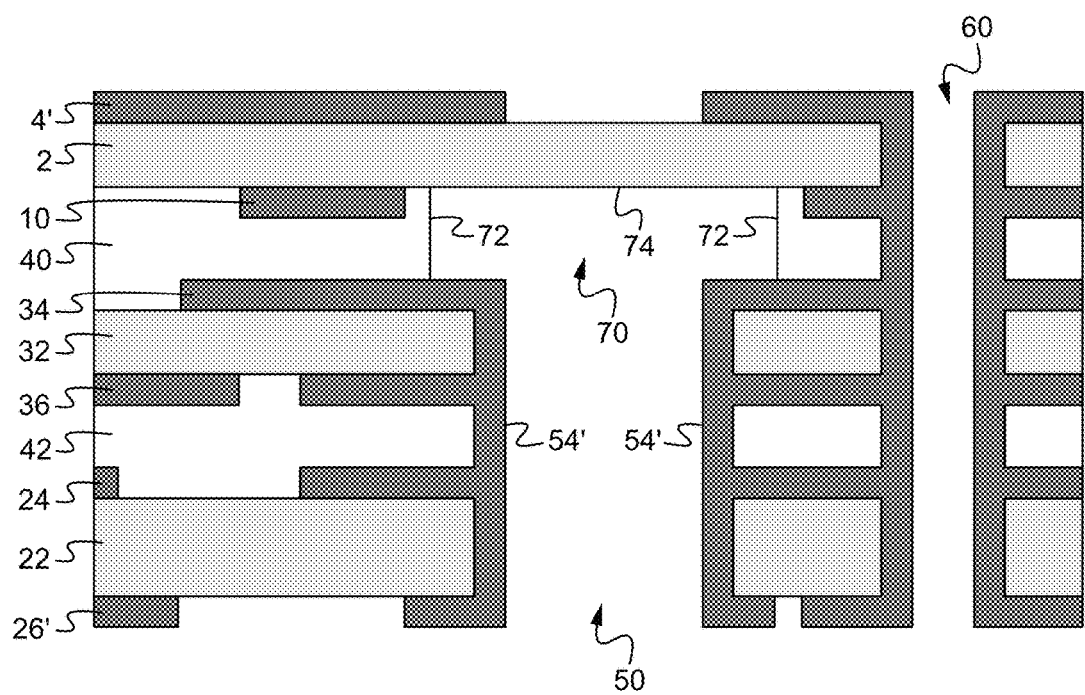
FIG. 1 illustrates a cut-out side view of a PCB including a disconnect cavity according to some embodiments.

FIG. 1 illustrates a cut out side view of a PCB including a disconnect cavity according to some embodiments. The PCB is a laminated stack having a plurality of non-conductive layers and a plurality of conductive layers. In the exemplary configuration shown in FIG. 1, the PCB includes conductive layers 4', 10, 24, 26', 34 and 36 and non-conductive layers 2, 22, 32, 40 and 42. Each conductive layer is patterned to form electrically conductive interconnects. Although not shown in FIG. 1, electrically conductive vias can be formed in the laminated stack to electrically interconnect one or more conductive layers. A conductive layer can be formed, for example, from a copper foil or laminate, where a laminate includes a non-conductive layer such as base material and a conductive layer on one or both sides of non-conductive layer. In some embodiments, a conductive layer is representative of a multilayer buildup that can include many interspersed conductive and non-conductive layers.

Each non-conductive layer is made of a non-conductive, insulating layer, such as prepreg or base material. The prepreg used herein is a regular flow prepreg, which enables a regular pressure to be used during a subsequent lamination step. In the PCB industry, "low flow" prepreg, such as that described in the background, is a general term to describe prepreg with lower resin flow than "regular flow" prepreg. "Low flow" prepreg usually has resin flow that is less than 100 mil. "Regular flow" prepreg has resin flow that is greater than 100 mil. A base material is an organic or inorganic material used to support a pattern of conductor material. Base material and prepreg each include resin and glass cloth, but the resin in base material is already fully cured and as such does not flow during lamination. The resin in prepreg is only partially cured and therefore flows during lamination. It is understood that the number of non-conductive layers and conductive layers shown in FIG. 1 is merely a design choice and that fewer or greater numbers of non-conductive layers and conductive layers can be included.

Prior to stack-up and lamination of the printed circuit board layers, plating resist is added onto a portion of one of the non-conductive layers. In some embodiments, the plating resist is a photo definable, or photo imageable, polymer structure. In some embodiments, the photo imageable polymer structure is a liquid photoimage ink (LPI). Subsequent description is directed to plating resist, where it is understood that any suitable plating resist material can be used. The area of the applied plating resist onto the non-conductive layer corresponds to a bottom surface of a subsequently formed disconnect cavity. The volume of the applied plating resist corresponds to a volume of the subsequently formed disconnect cavity. The plating resist is applied on a surface of the non-conductive layer, then exposed and developed to form a plating resist layer. In some embodiments, the plating resist includes a resin, a photo-activator or photo-initiator, and cross-linking agents that upon being subject to light become solid and remain attached to an underlying substrate. Any material not subject to light is easily washed away. In some embodiments, photolithography is used as a process for forming the plating resist layer. It is understood that other conventional processes can be used.

The plating resist prevents prepreg from flowing into the subsequent disconnect cavity volume during the lamination process. After lamination, a routing process is performed from an outer surface of the laminated stack to the plating resist layer within the laminated stack, so as to remove a portion of the laminated stack and expose the plating resist layer. The routing process can include mechanical routing, laser routing or mechanical plus laser routing within a footprint of the plating resist layer. The exposed plating resist layer is substantially stripped away by a chemical stripping process. In some embodiments, the plating resist layer is completely removed and the resulting disconnect cavity is free from plating resist material. In other embodiments, a residual amount of plating resist material remains on one or more surfaces of the disconnect cavity.

In the exemplary configuration shown in FIG. 1, a cavity 50 is formed where the routing process was performed, and a disconnect cavity 70 is formed where the plating resist layer was removed. The cavity 50 has plated side walls 54'. However, side walls 72 and a bottom surface 74 of the disconnect cavity 70 are free of conductive material. A depth of the disconnect cavity 70 is a function of the thickness of the removed plating resist layer. It is understood that the depth of the disconnect cavity can be varied by varying the thickness of the applied plating resist material. A cross-sectional area of the disconnect cavity can be increased or decreased by increasing or decreasing the area onto which the plating resist is applied to the non-conductive layer. Similarly, a cross-sectional shape of the cavity is determined by a shape of the plating resist layer, for example as a rectangle or a circle.

Figure 2:
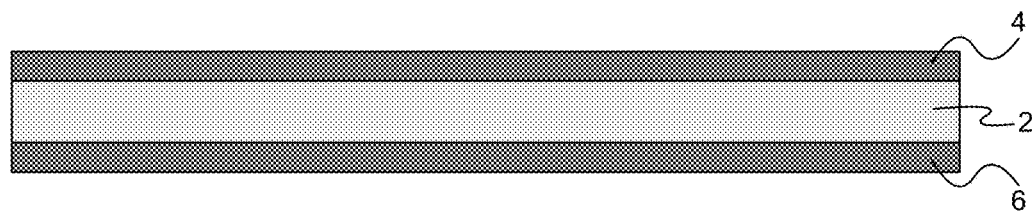
FIGS. 2-9 illustrate various steps in the process used to manufacture the PCB including the disconnect cavity according to some embodiments.

FIGS. 2-9 illustrate various steps in the process used to manufacture a PCB having a disconnect cavity according to some embodiments. The PCB manufactured using the various steps shown in FIGS. 2-9 is similar to and shares features of the PCB and constituent layers shown in FIG. 1. Each of the FIGS. 2-9 illustrate a cut out side view of the PCB according to the various process steps. In FIG. 2, an exemplary core structure is shown. The core structure is a metal clad structure including the non-conductive layer 2 and conductive layers 4, 6 formed on both opposing surfaces. It is understood that an alternative core structure can be used which includes a conductive layer on only one surface of the non-conductive layer.

Figure 3:
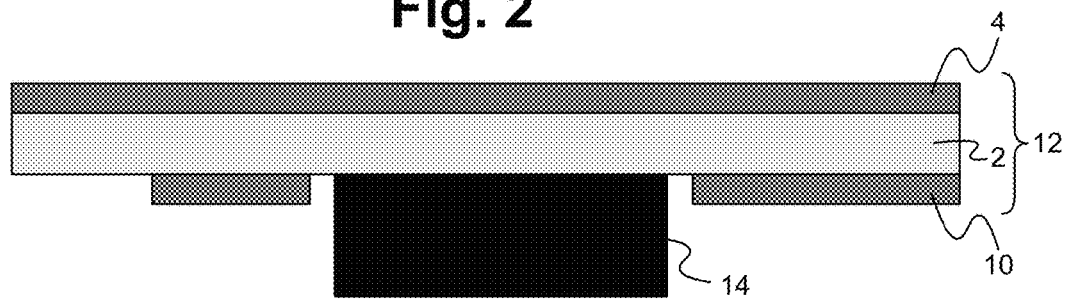

In FIG. 3, the conductive layer 6 is selectively pattern etched to form interconnect circuitry 10. A select portion of the conductive layer 6 is removed so as to subsequently form a bottom surface of the disconnect cavity on a surface of the non-conductive layer 2. Alternatively, the conductive layer 6 is already pattern etched during fabrication of the core structure in FIG. 2. It is understood that FIG. 2-9 only show a portion of the PCB and in particular only show a portion of the core structure. Additional interconnects and circuitry may be formed on portions of the core structure not shown in FIGS. 2-9. The non-conductive layer 2, the conductive layer 4 and the interconnect circuitry 10 form core structure 12. A plating resist layer 14 is formed on the core structure 12. In particular, the plating resist layer 14 is formed on a portion of the non-conductive layer 2 of the core structure 12, as shown in FIG. 3. A footprint of the plating resist layer 14 matches a footprint of the subsequently formed disconnect cavity, and a volume of the plating resist layer 14 matches a volume of the subsequently formed disconnect cavity.

Figure 4:
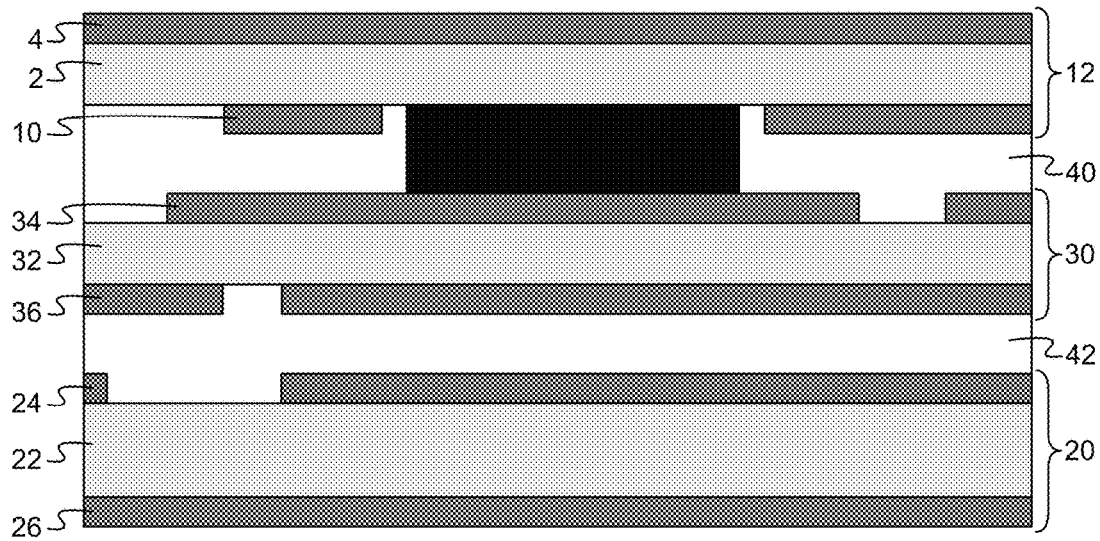

In FIG. 4, additional core structures are fabricated. The additional core structures can be similar to the core structure 12 of FIG. 3 with the conductive layers pattern etched accordingly. In most instances, the additional core structures are made using a non-conductive base material. In the exemplary configuration shown in FIG. 4, two additional core structures 20 and 30 are included. The core structure 20 is a metal clad structure including a non-conductive layer 22 and conductive layers 24, 26 formed on both opposing surfaces. The conductive layer 24 is selectively pattern etched. The core structure 30 is a metal clad structure including a non-conductive layer 32 and conductive layers 34, 36 formed on both opposing surfaces. The conductive layers 34, 36 are selectively pattern etched. It is understood that alternatively configured core structures can be used which include a conductive layer on only one surface of the non-conductive layer.

The core structure 12 with plating resist layer 14, the core structure 20 and the core structure 30 are stacked with intervening non-conductive layers, such as regular flow prepreg layers 40 and 42. Non-conductive layer 40 is pre-cut to fit around the plating resist layer 14. As described above, the dimensions of the disconnect cavity are determined by the volume and shape of the plating resist layer.

A single lamination step using standard lamination pressure results in the laminated stack shown in FIG. 4. Any conventional lamination technique can be used. As used herein, standard lamination pressure refers to the lamination pressure used with "regular flow" prepreg. With "regular flow" prepreg, lamination pressure is less than about 450 psi. With "low flow" prepreg, lamination pressure is more than about 450 psi.

Figure 5:
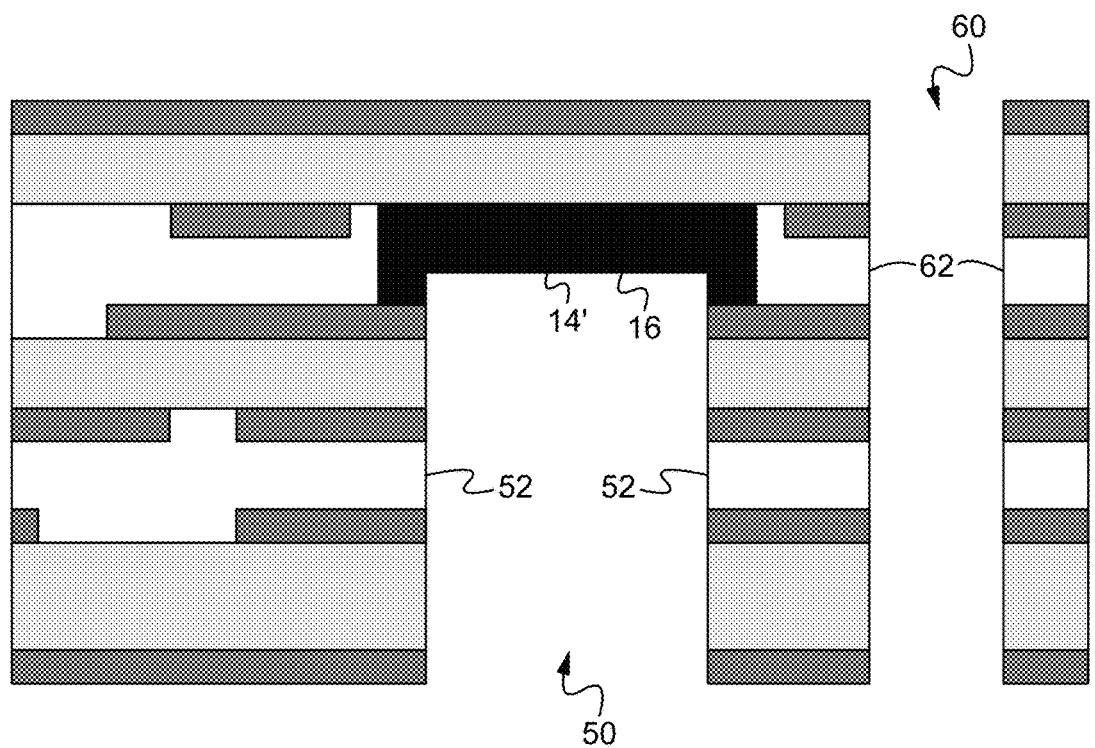

In FIG. 5, the cavity 50 is formed. In some embodiments, the cavity 50 is formed by a depth controlled routing process. The routing process can include mechanical routing, laser routing or mechanical plus laser routing. It is understood that the cavity can be formed using means other than routing. The perimeter of the cavity 50 is formed within a perimeter of the plating resist layer 14, resulting in cavity side walls 52 that are within the plating resist layer footprint. A depth of the routing is to at least the plating resist layer 14. In some embodiments, the routing depth is into the plating resist layer, shown in FIG. 5, such that a portion of the plating resist layer is removed, leaving remaining plating resist layer 14' with exposed plating resist surface 16. Additionally, selective through holes, such as through hole 60, are formed through the laminated stack of FIG. 5. In some embodiments, the through holes are formed by drilling. Through holes can be formed in those portions of the PCB not corresponding to a cavity or disconnect cavity.

Figure 6:
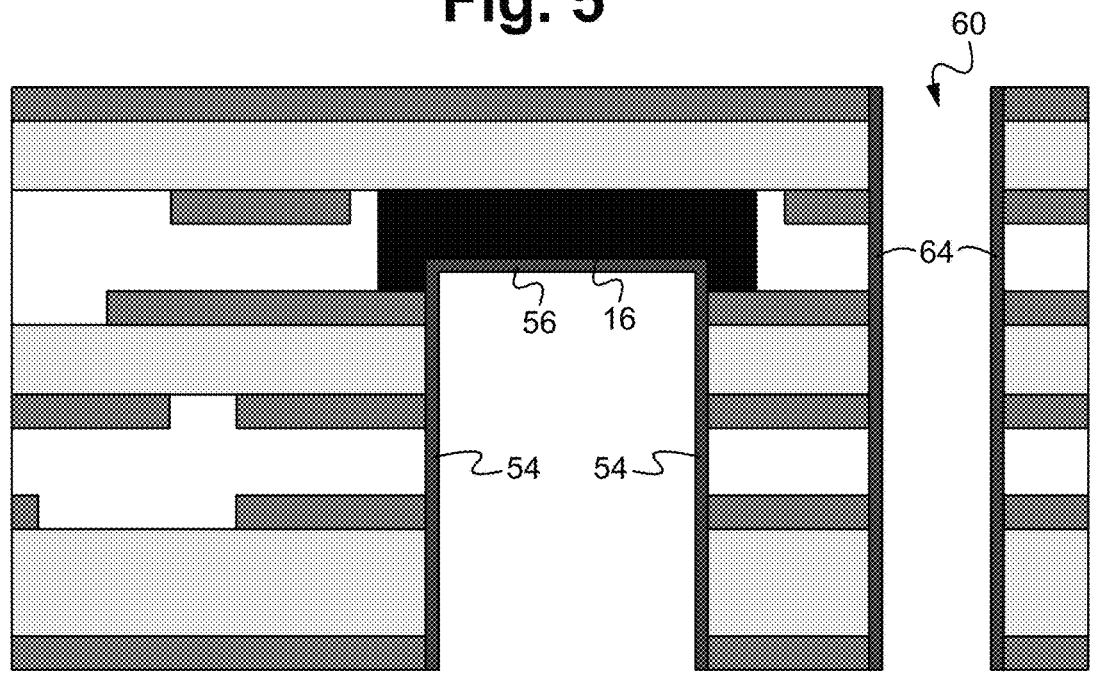

In FIG. 6, a desmear process is performed to remove residue, such as residual particles from the formation of the cavity 50 and the through hole 60. Next, an electroless plating process is performed to form plating 54 on the side walls 52 (FIG. 5) of the cavity 50 and to form plating 56 on the exposed plating resist surface 16. The electroless plating process also forms plating 64 on the side walls 62 (FIG. 5) of the through hole 60, thereby forming a through hole via. In some embodiments, copper is used as the plating material. It is understood that other plating materials can be used. The plating 54 forms an interconnect with various conductive layers in the stack. The plating 64 also forms an interconnect with various conductive layers in the stack.

Figure 7:
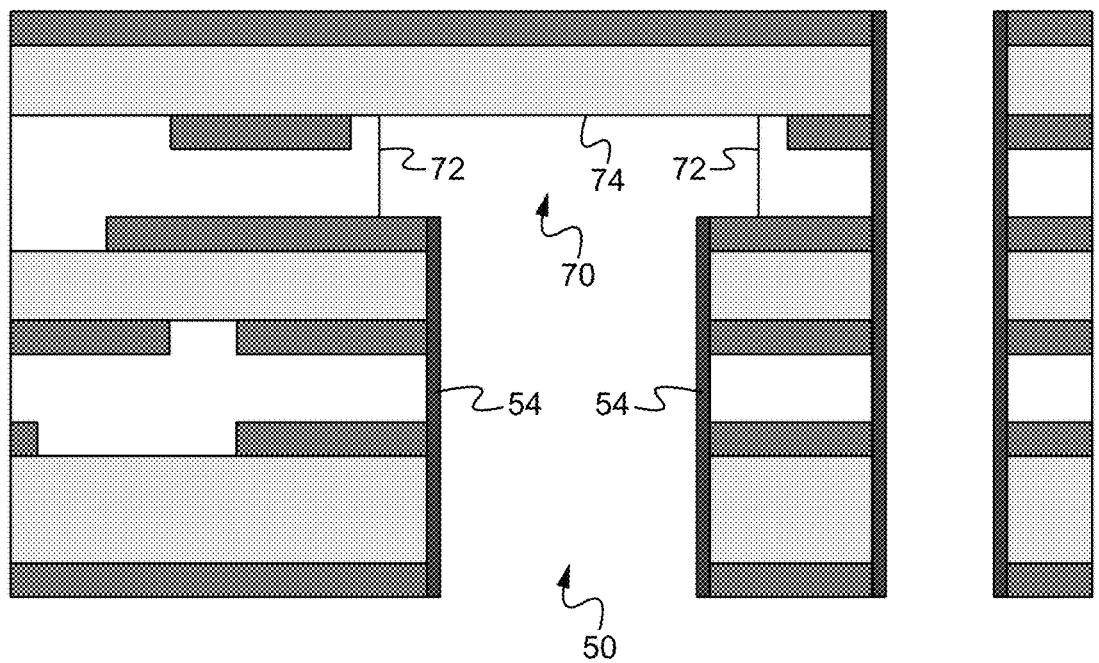

In FIG. 7, a plating resist stripping process is performed. During the plating resist stripping process, both the plating 56 attached to the plating resist layer 14' and the plating resist layer 14' are removed, thereby forming the disconnect cavity 70 with side walls 72 and bottom surface 74 free of conductive material, such as plating. The plating 56 deposited during the electroless plating process in FIG. 6 does not deposit well onto the plating resist layer 14'. The adhesion bond between the plating 56 and the plating resist layer 14' is not as strong as the adhesion bond between the plating 54 and the other layers exposed in the cavity 50. As such, during the plating resist stripping process, the stripping chemistry attacks the plating 56 more readily than the plating 54. Once the plating 56 is removed the stripping chemistry attacks and removes the plating resist layer 14', leaving the plating 54 substantially intact.

Figure 8:
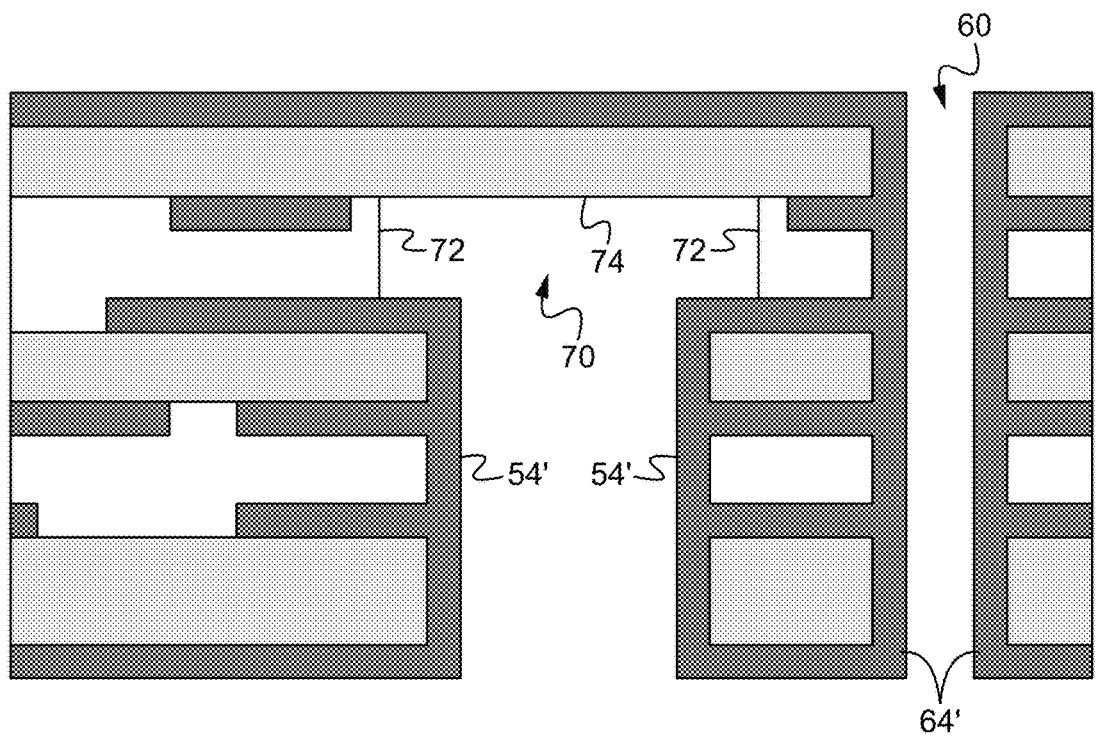

In FIG. 8, an electroplating process is performed resulting in a thicker plating 54' on the side walls of the cavity 50 and a thicker plating 64' on the side walls of the through hole via 60. In some embodiments, copper is used as the plating material. To perform the electroplating process, electricity is applied to the side wall plating of the cavity 50 and the side wall plating of the through hole via 60. However, due to the lack of plating on the side walls 72 and bottom surface 74 of the disconnect cavity 70, the plating 54 (FIG. 7) of the cavity 50 is not electrically connected to the side walls 72 and the bottom surface 74 of the disconnect cavity 70. As such, no plating is formed on the side walls 72 and the bottom surface 74 of the disconnect cavity 70 during the electroplating process.

Figure 9:
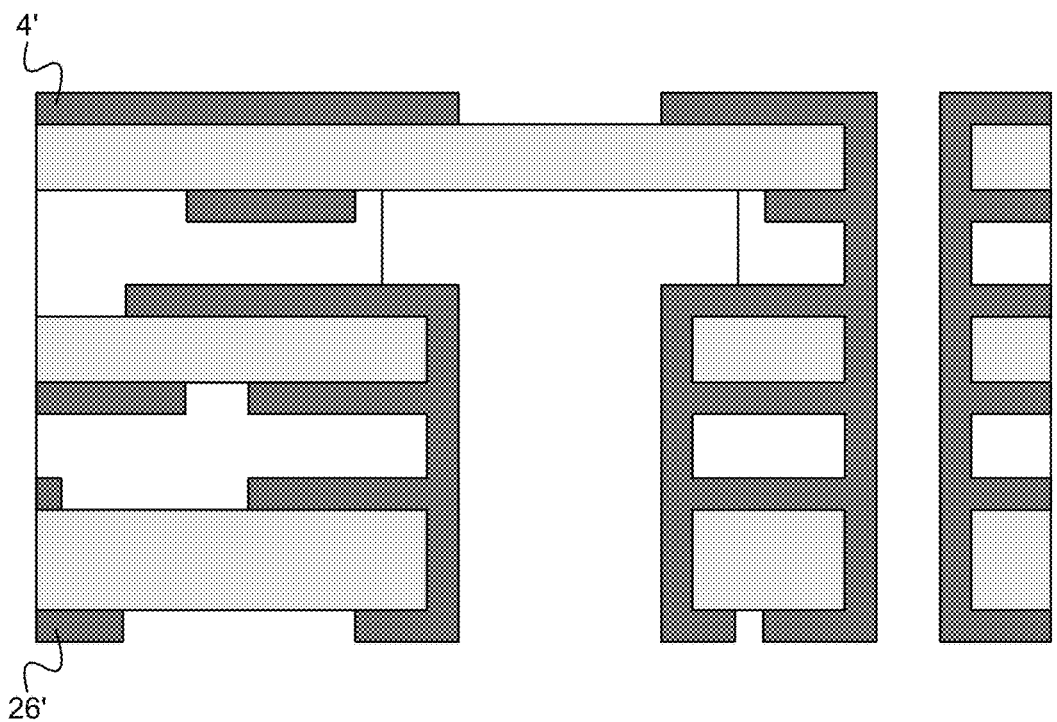

In FIG. 9, an outer conductive layer etching process is performed. The conductive layers 4 and 26 on the top and bottom, respectively, of the laminated stack are selectively pattern etched to form patterned conductive layers 4' and 26'.

Figure 10:
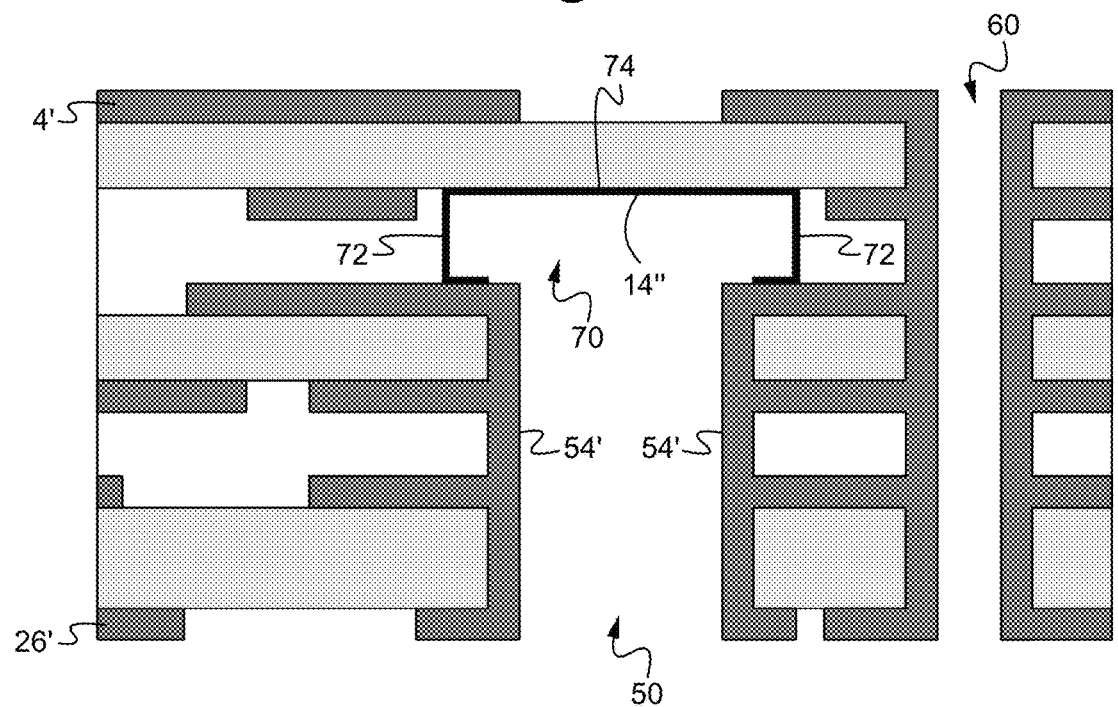
FIG. 10 illustrates a cut-out side view of the PCB including the disconnect cavity in FIG. 1 with residual plating resist.

In some embodiments, a residual amount of plating resist material remains on one or more surfaces of the disconnect cavity 70 after the stripping process. In this case, there is a residual amount of plating resist material on one or more surfaces of the disconnect cavity 70 of the completed PCB. FIG. 10 illustrates a cut-out side view of the PCB including the disconnect cavity in FIG. 1 with residual plating resist 14". As shown in FIG. 10, the residual plating resist 14" remains as a layer on each of the surfaces of the disconnect cavity 70. It is understood that the residual plating resist can remain as a layer on either the side walls 72 or the bottom surface 74. It is also understood that the residual plating resist is not necessarily a layer over the entire side wall and/or bottom surface, but instead is one or more sporadic portions variously scattered across one or more surfaces of the disconnect cavity.

Figure 11:
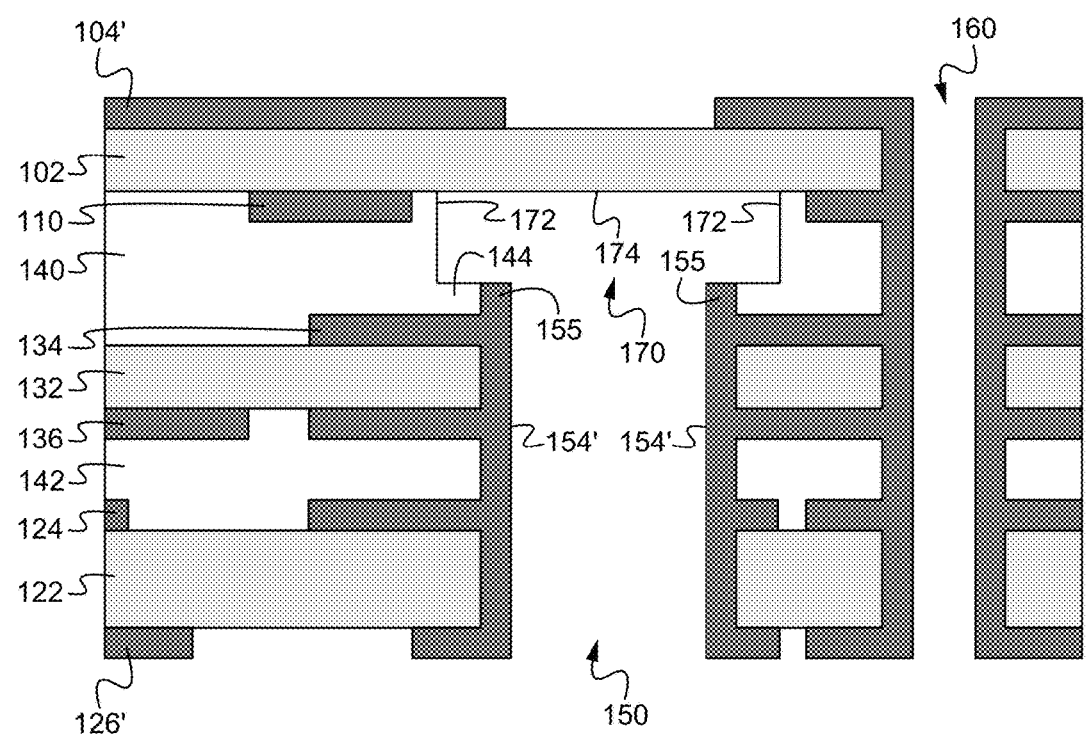
FIG. 11 illustrates a cut out side view of a PCB including a disconnect cavity according to other embodiments.

The disconnect cavity shown in FIG. 1 is formed by stacking the plating resist layer 14 (FIG. 4) against the conductive layer 34. A disconnect cavity can be alternatively formed by stacking the plating resist layer 14 against a non-conductive layer. Such a configuration may be desirable depending on the thickness specifications of the plating resist material and surrounding non-conductive layer 40. FIG. 11 illustrates a cut out side view of a PCB including a disconnect cavity according to other embodiments. The PCB shown in FIG. 11 is similar to the PCB of FIG. 1 except a disconnect cavity 150 in the PCB of FIG. 11 is formed entirely within non-conductive layers of a PCB stack-up. As a result, end portions of cavity plated side walls 154' of a cavity 150 adjacent the disconnect cavity 170 form via stubs 155. Side walls 172 and a bottom surface 174 of the disconnect cavity 170 are free of conductive material. Similar to the PCB in FIG. 1, the PCB in FIG. 11 is a laminated stack having a plurality of non-conductive layers and a plurality of conductive layers. In the exemplary configuration shown in FIG. 11, the PCB includes conductive layers 104', 110, 124, 126', 134 and 136 and non-conductive layers 102, 122, 132, 140, 142 and 144. Each conductive layer is selectively pattern etched to form electrically conductive interconnects. Although not shown in FIG. 11, electrically conductive vias can be formed in the laminated stack to electrically interconnect one or more conductive layers.

Figure 12:
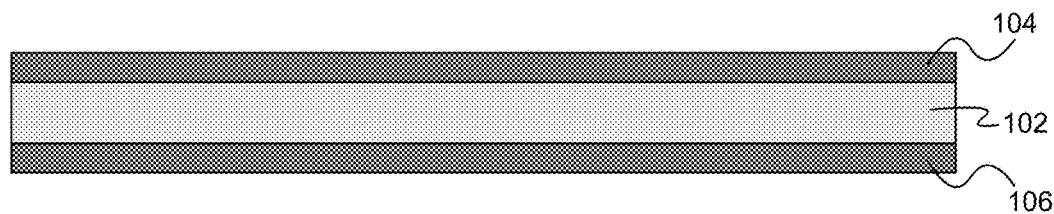
FIGS. 12-19 illustrate various steps in the process used to manufacture the PCB including the disconnect cavity according to other embodiments.

FIGS. 12-19 illustrate various steps in the process used to manufacture a PCB having a disconnect cavity according to other embodiments. The PCB manufactured using the various steps shown in FIGS. 12-19 is similar to and shares features of the PCB and constituent layers shown in FIG. 11. Each of the FIGS. 12-19 illustrate a cut out side view of the PCB according to the various process steps. In FIG. 12, an exemplary core structure is shown. The core structure is a metal clad structure including the non-conductive layer 102 and conductive layers 104, 106 formed on both opposing surfaces. It is understood that an alternative core structure can be used which includes a conductive layer on only one surface of the non-conductive layer.

Figure 13:
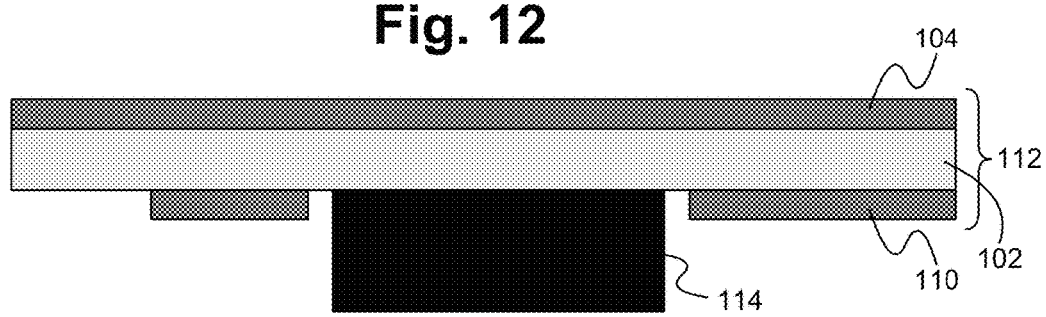

In FIG. 13, the conductive layer 106 is selectively pattern etched to form interconnect circuitry 110. A select portion of the conductive layer 106 is removed so as to subsequently form a bottom surface of the disconnect cavity on a surface of the non-conductive layer 102. Alternatively, the conductive layer 106 is already pattern etched during fabrication of the core structure in FIG. 12. It is understood that FIG. 12-19 only show a portion of the PCB and in particular only show a portion of the core structure. Additional interconnects and circuitry may be formed on portions of the core structure not shown in FIGS. 12-19. The non-conductive layer 102, the conductive layer 104 and the interconnect circuitry 110 form core structure 112. A plating resist layer 114 is formed on the core structure 112. In particular, the plating resist layer 114 is formed on a portion of the non-conductive layer 102 of the core structure 112, as shown in FIG. 13. A footprint of the plating resist layer 114 matches a footprint of the subsequently formed disconnect cavity, and a volume of the plating resist layer 114 matches a volume of the subsequently formed disconnect cavity.

Figure 14:
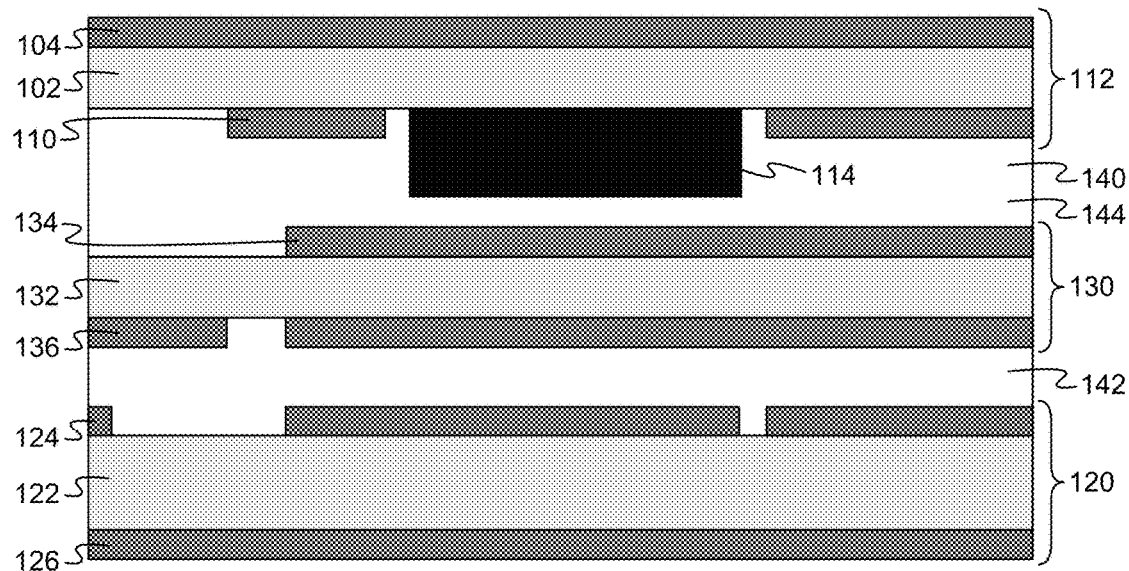

In FIG. 14, additional core structures are fabricated. The additional core structures can be similar to the core structure 112 of FIG. 13 with the conductive layers pattern etched accordingly. In most instances, the additional core structures are made using a non-conductive base material. In the exemplary configuration shown in FIG. 14, two additional core structures 120 and 130 are included. The core structure 120 is a metal clad structure including a non-conductive layer 122 and conductive layers 124, 126 formed on both opposing surfaces. The conductive layer 124 is selectively pattern etched. The core structure 130 is a metal clad structure including a non-conductive layer 132 and conductive layers 134, 136 formed on both opposing surfaces. The conductive layers 134, 136 are selectively pattern etched. It is understood that alternatively configured core structures can be used which include a conductive layer on only one surface of the non-conductive layer.

The core structure 112 with plating resist layer 114, the core structure 120 and the core structure 130 are stacked with intervening non-conductive layers, such as regular flow prepreg layers 140, 142 and 144. Non-conductive layer 140 is pre-cut to fit around the plating resist layer 114. The non-conductive layer 144 is positioned between the plating resist layer 114 and the conductive layer 134. As described above, the dimensions of the disconnect cavity are determined by the volume and shape of the plating resist layer.

A single lamination step using standard lamination pressure results in the laminated stack shown in FIG. 14. Any conventional lamination technique can be used.

Figure 15:
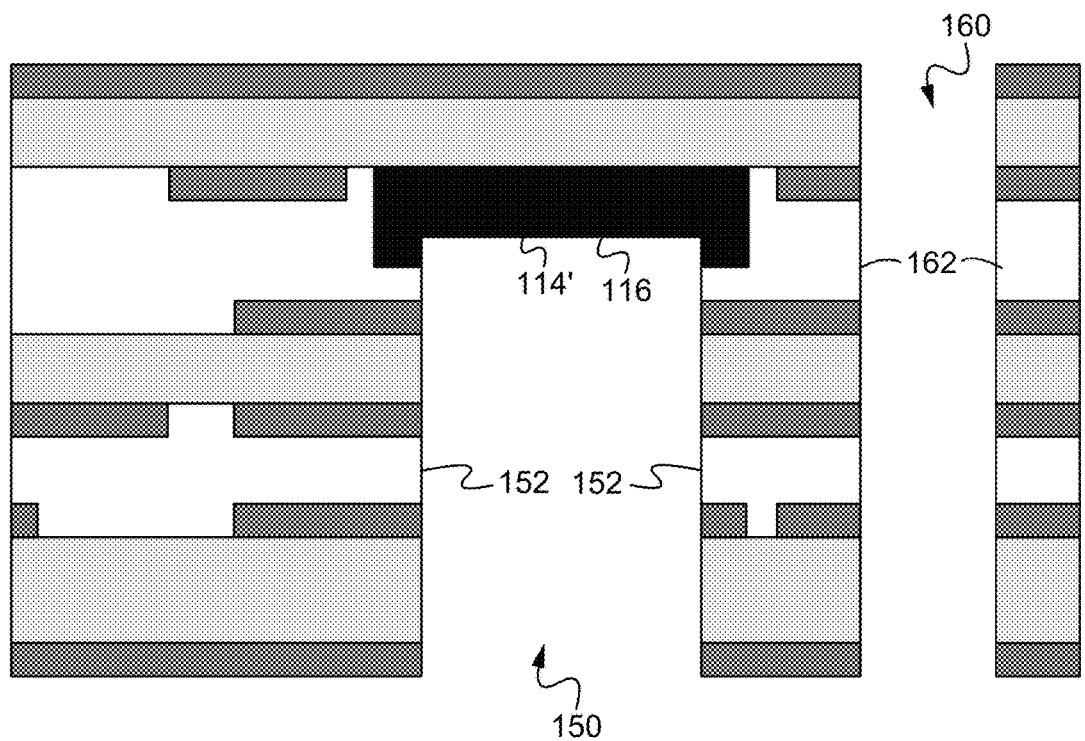

In FIG. 15, the cavity 150 is formed. In some embodiments, the cavity 150 is formed by a depth controlled routing process. The routing process can include mechanical routing, laser routing or mechanical plus laser routing. It is understood that the cavity can be formed using means other than routing. The perimeter of the cavity 150 is formed within a perimeter of the plating resist layer 114, resulting in cavity side walls 152 that are within the plating resist layer footprint. A depth of the routing is to at least the plating resist layer 114. In some embodiments, the routing depth is into the plating resist layer, shown in FIG. 15, such that a portion of the plating resist layer is removed, leaving remaining plating resist layer 114' with exposed plating resist surface 116. Additionally, selective through holes, such as through hole 160, are formed through the laminated stack of FIG. 15. In some embodiments, the through hole are formed by drilling. Through holes can be formed in those portions of the PCB not corresponding to a cavity or disconnect cavity.

Figure 16:
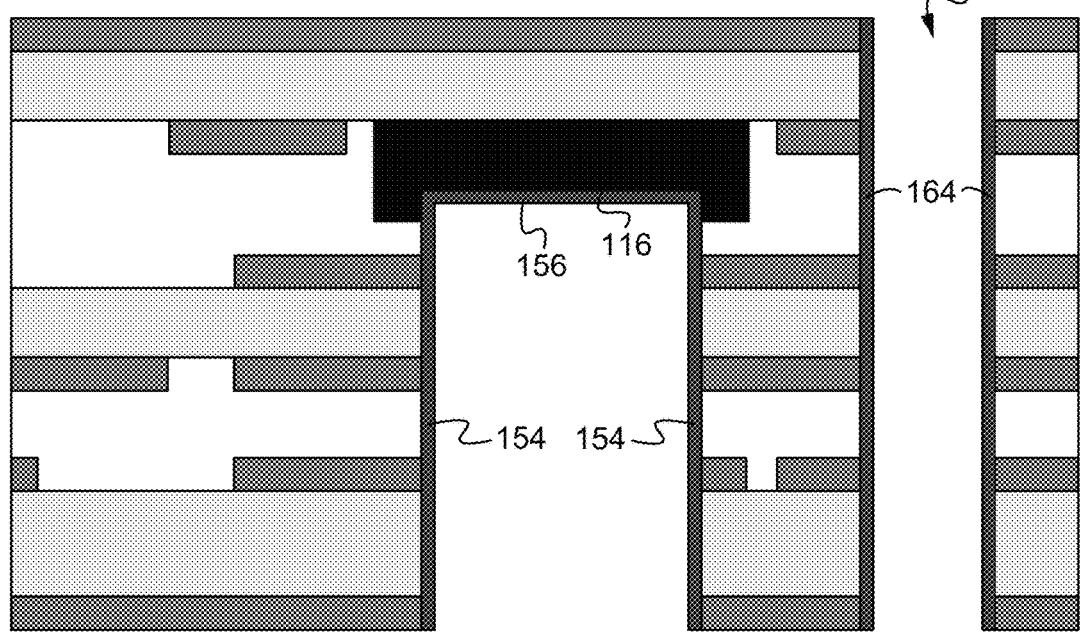

In FIG. 16, a desmear process is performed to remove residue, such as residual particles from the formation of the cavity 150 and the through hole 160. Next, an electroless plating process is performed to form plating 154 on the side walls 152 (FIG. 15) of the cavity 150 and to form plating 156 on the exposed plating resist surface 116. The electroless plating process also forms plating 164 on the side walls 162 (FIG. 15) of the through hole 160, thereby forming a through hole via. In some embodiments, copper is used as the plating material. It is understood that other plating materials can be used. The plating 154 forms an interconnect with various conductive layers in the stack. The plating 164 also forms an interconnect with various conductive layers in the stack.

Figure 17:
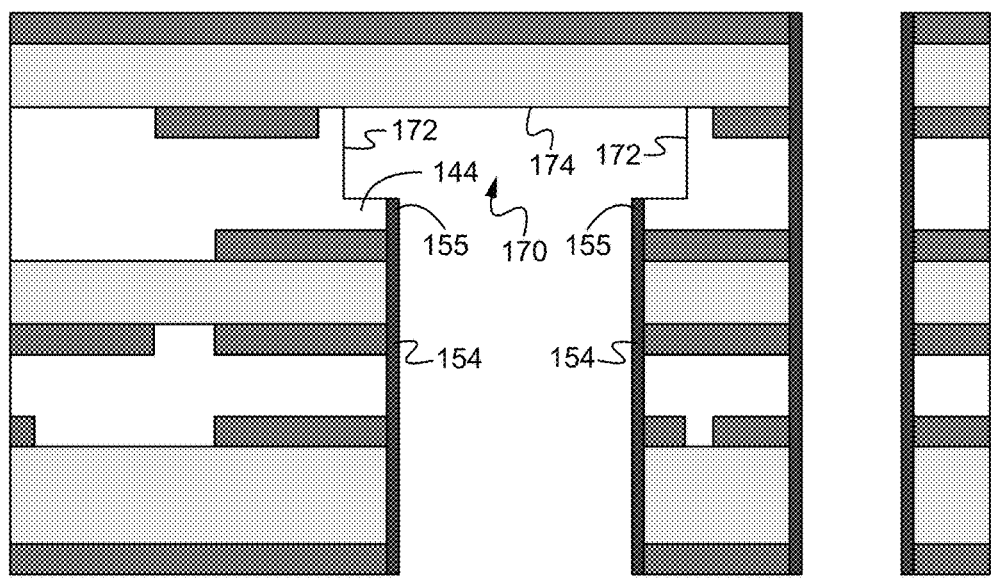

In FIG. 17, a plating resist stripping process is performed. During the plating resist stripping process, both the plating 156 attached to the plating resist layer 114' and the plating resist layer 114' are removed, thereby forming the disconnect cavity 170 with side walls 172 and bottom surface 174 free of conductive material, such as plating. The plating 156 deposited during the electroless plating process in FIG. 16 does not deposit well onto the plating resist layer 114'. The adhesion bond between the plating 156 and the plating resist layer 114' is not as strong as the adhesion bond between the plating 154 and the other layers exposed in the cavity 150. As such, during the plating resist stripping process, the stripping chemistry attacks the plating 156 more readily than the plating 154. Once the plating 156 is removed the stripping chemistry attacks and removes the plating resist layer 114', leaving the plating 154 substantially intact. Since the plating resist layer 114 (FIG. 13) was stacked against the non-conductive layer 144, the plating 154 is also present on the portion of the side wall 152 corresponding to the non-conductive layer 144, thereby forming a plating stub 155.

Figure 18:
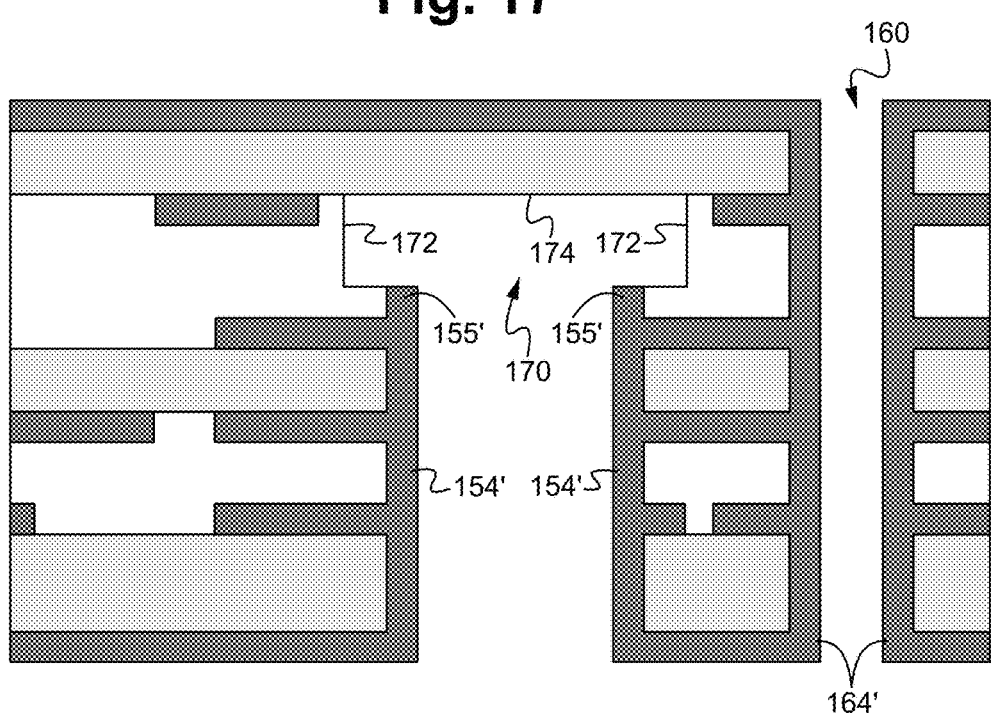

In FIG. 18, an electroplating process is performed resulting in a thicker plating 154' on the side walls of the cavity 50, including thicker plating 155', and a thicker plating 164' on the side walls of the through hole via 160. In some embodiments, copper is used as the plating material. To perform the electroplating process, electricity is applied to the side wall plating of the cavity 150 and the side wall plating of the through hole via 160. However, due to the lack of plating on the side walls 172 and bottom surface 174 of the disconnect cavity 170, the plating 154, 155 (FIG. 17) of the cavity 150 is not electrically connected to the side walls 172 and the bottom surface 174 of the disconnect cavity 170. As such, no plating is formed on the side walls 172 and the bottom surface 174 of the disconnect cavity 170 during the electroplating process.

Figure 19:
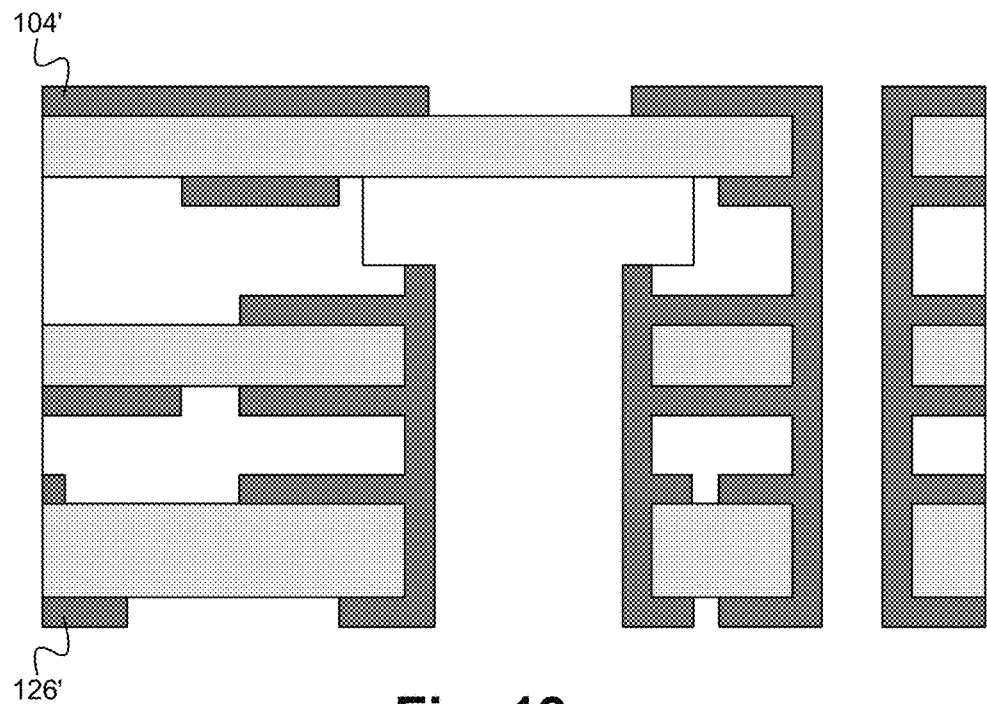

In FIG. 19, an outer conductive layer etching process is performed. The conductive layers 104 and 126 on the top and bottom, respectively, of the laminated stack are selectively pattern etched to form patterned conductive layers 104' and 126'.

Figure 20:
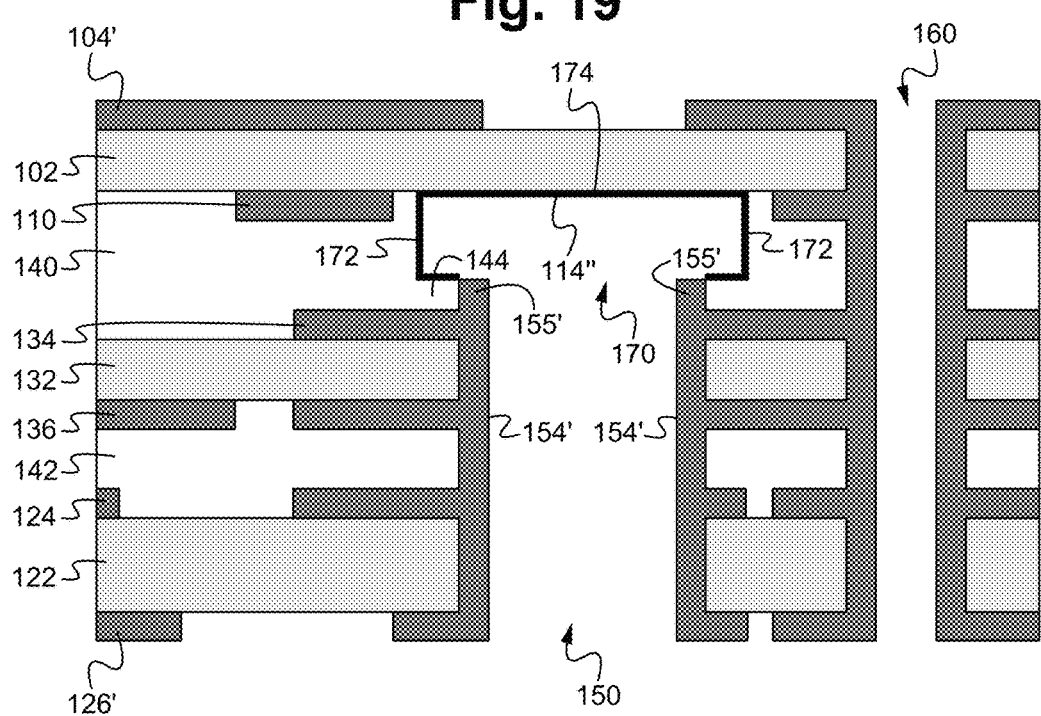
FIG. 20 illustrates a cut-out side view of the PCB including the disconnect cavity in FIG. 11 with residual plating resist.

In some embodiments, a residual amount of plating resist material remains on one or more surfaces of the disconnect cavity 170 after the stripping process. In this case, there is a residual amount of plating resist material on or more surfaces of the disconnect cavity 170 of the completed PCB. FIG. 20 illustrates a cut-out side view of the PCB including the disconnect cavity in FIG. 10 with residual plating resist 114". As shown in FIG. 20, the residual plating resist 114" remains as a layer on each of the surfaces of the disconnect cavity 170. It is understood that the residual plating resist can remain as a layer on either the side walls 172 or the bottom surface 174. It is also understood that the residual plating resist is not necessarily a layer over the entire side wall and/or bottom surface, but instead is one or more sporadic portions variously scattered across one or more surfaces of the disconnect cavity.

It is understood that the various structural configurations shown in the embodiments of FIGS. 1-20 and the position of the disconnect cavity can be different according to a specific application and application requirement.

The disconnect cavity by plating resist process and structure solves the issue of resin squeeze out as found in low flow prepreg manufacturing processes and it allows freedom in selecting normal prepreg thickness and prepreg supplier. In prior art PCBs, a PCB having a disconnect cavity is formed using low flow prepreg as well as lamination accessories such as release film and conformal film. Use of low flow prepreg is needed to control squeeze out during lamination. However, since low flow prepreg is used, a greater lamination pressure is required which results in surface ripple on the PCB exterior surfaces. Under high pressure the underlying topography of the inner layer circuitry is reflected on the surface resulting in the irregular, or rippled, surface. In the present application, there is no need to control resin squeeze out, there is no limitation in prepreg selection, and there is no need of lamination accessories or high lamination pressure, which results in a flat exterior surfaces. The present process improves board flatness that solves impedance control issues and improves reliability of surface mounted component connections. Yield of fine line 2/2 mil etching and solder mask fine line imaging is also improved because of the flat exterior surfaces. Without use of lamination accessories and with yield improvement, the process of the present application saves running cost dramatically. Higher pressure lamination as used in conventional processes leads to expansion in the X-Y plane of the PCB. Such lateral expansion moves surface contact pads relative to their designed positions. The present process uses standard lamination pressure and therefore reduces lateral expansion. Such dimensional control is becoming more and more significant with smaller and smaller pitch components to be surface mounted. Additionally, a selective copper etching process is not required to disconnect the disconnect cavity wall from the PCB landing layer. This prevents uncontrolled etching of connected via plating and makes the whole manufacturing process simpler and gives higher production yield.

The present application has been described in terms of specific embodiments incorporating details to facilitate the understanding of the principles of construction and operation of the PCB having a disconnect cavity. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A printed circuit board comprising:
   a. a laminated stack comprising a plurality of non-conducting layers and a plurality of conductive layers;
   b. a via formed from an outer surface of the laminated stack and terminating within the laminated stack at a terminating end; and
   c. a disconnect cavity at the terminating end of the via, wherein the disconnect cavity comprises a bottom surface that forms a closed end of the disconnect cavity and disconnect cavity side walls, further wherein the bottom surface and the disconnect cavity side walls are free of conductive plating.

2. The printed circuit board of claim 1 wherein the via comprises via side walls extending from the outer surface to the disconnect cavity, wherein the via side walls are plated with conductive material.

3. The printed circuit board of claim 1 wherein the disconnect cavity further comprises an opposing surface opposite the bottom surface, wherein the opposing surface has an opening coincident with the terminating end of the via, the disconnect cavity is completely enclosed within the terminated stack, in cross-section, except for the opening to the via.

4. The printed circuit board of claim 3 wherein the opposing surface is a surface of one of the conductive layers.

5. The printed circuit board of claim 4 wherein the via comprises via side walls extending from the outer surface to the disconnect cavity, wherein the via side walls are plated with conductive material and the plated via side walls are coupled to the opposing surface of the disconnect cavity.

6. The printed circuit board of claim 3 wherein the opposing surface is a surface of one of the non-conductive layers.

7. The printed circuit board of claim 6 wherein the via comprises via side walls extending from the outer surface to the disconnect cavity, wherein the via side walls are plated with conductive material and the plated via side walls are coupled to the opposing surface of the disconnect cavity.

8. The printed circuit board of claim 1 further comprising residual plating resist on at least portions of the bottom surface, the disconnect cavity side walls or both the bottom surface and the disconnect cavity side walls.

9. The printed circuit board of claim 8 wherein the residual plating resist is a remnant of a plating resist layer that formed a volume of the disconnect cavity.

10. The printed circuit board of claim 9 wherein the plating resist layer prevented plating of the bottom surface and the disconnect cavity side walls.

11. The printed circuit board of claim 1 wherein each of the conductive layers is pattern etched.

* * * * *